(12) United States Patent
Yong et al.

(10) Patent No.: US 12,234,551 B2
(45) Date of Patent: Feb. 25, 2025

(54) CARBON NANOTUBE PREPARATION SYSTEM

(71) Applicant: SUZHOU JERNANO CARBON CO., LTD., Jiangsu (CN)

(72) Inventors: Zhenzhong Yong, Suzhou (CN); Qingwen Li, Suzhou (CN); Hehua Jin, Suzhou (CN); Da Li, Suzhou (CN); Zhi Li, Suzhou (CN)

(73) Assignee: SUZHOU JERNANO CARBON CO., LTD., Jiangsu (CN)

( * ) Notice: Subject to any disclaimer, the term of this patent is extended or adjusted under 35 U.S.C. 154(b) by 1010 days.

(21) Appl. No.: 17/042,001

(22) PCT Filed: Mar. 26, 2018

(86) PCT No.: PCT/CN2018/080531
§ 371 (c)(1),
(2) Date: Sep. 25, 2020

(87) PCT Pub. No.: WO2019/183766
PCT Pub. Date: Oct. 3, 2019

(65) Prior Publication Data
US 2021/0025055 A1    Jan. 28, 2021

(51) Int. Cl.
*C23C 16/448*   (2006.01)
*C01B 32/16*    (2017.01)
(Continued)

(52) U.S. Cl.
CPC .......... *C23C 16/4486* (2013.01); *C01B 32/16* (2017.08); *C23C 16/26* (2013.01);
(Continued)

(58) Field of Classification Search
CPC .......... C01B 32/16; C01B 32/158–178; C23C 16/26; C23C 16/4486; C23C 16/45519; B82Y 30/00; B82Y 40/00
See application file for complete search history.

(56) References Cited

U.S. PATENT DOCUMENTS

| | | |
|---|---|---|
| 2010/0247419 A1 | 9/2010 | Nguyen |
| 2013/0142987 A1* | 6/2013 | Wardle ..................... B82B 1/00 |
| | | 156/60 |

(Continued)

FOREIGN PATENT DOCUMENTS

| | | |
|---|---|---|
| CN | 1962426 | 5/2007 |
| CN | 101372329 | 2/2009 |

(Continued)

OTHER PUBLICATIONS

Machine translation of CN 203558855 U, the original was submitted through the IDS filing in Sep. 25, 2020. (Year: 2023).*

(Continued)

*Primary Examiner* — Aiden Lee
(74) *Attorney, Agent, or Firm* — HSML P.C.

(57) ABSTRACT

A carbon nanotube preparation system, including: a pre-growth tube for an early pre-reaction of raw materials before generation of carbon nanotubes; an atomizer for atomizing the carbon nanotube raw materials and then spraying the atomized raw materials into the pre-growth tube; the atomizer is provided at the front end of the pre-growth tube, and has a spray output tube that extends into the pre-growth tube; a growth tube for generating carbon nanotubes and continuous growth of the generated carbon nanotubes; the front end of the growth tube is hermetically connected to the rear end of the pre-growth tube; and a gas curtain generator for forming a gas curtain enclosing the atomized raw materials around the outlet of the spray output tube, and the gas curtain (Continued)

extends parallel to the extension direction of the pre-growth tube; the gas curtain generator is provided inside the pre-growth tube.

13 Claims, 4 Drawing Sheets

(51) Int. Cl.
    *C23C 16/26*     (2006.01)
    *C23C 16/455*     (2006.01)
    *C23C 16/52*     (2006.01)
    *B82Y 30/00*     (2011.01)
    *B82Y 40/00*     (2011.01)

(52) U.S. Cl.
    CPC ........ *C23C 16/45519* (2013.01); *C23C 16/52* (2013.01); *B82Y 30/00* (2013.01); *B82Y 40/00* (2013.01)

(56) References Cited

U.S. PATENT DOCUMENTS

| | | | | |
|---|---|---|---|---|
| 2014/0123900 A1* | 5/2014 | Wang | ................ | C23C 16/45519 118/724 |
| 2015/0240391 A1 | 8/2015 | Oh et al. | | |
| 2017/0283945 A1* | 10/2017 | Yahata | .................... | C23C 16/52 |
| 2017/0292208 A1* | 10/2017 | Yoon | ..................... | C01B 32/162 |
| 2017/0314125 A1* | 11/2017 | Fenwick | ............... | C23C 16/405 |

FOREIGN PATENT DOCUMENTS

| | | |
|---|---|---|
| CN | 103253650 | 8/2013 |
| CN | 103435029 | 12/2013 |
| CN | 103569998 | 2/2014 |
| CN | 203558855 U | 4/2014 |
| CN | 104641028 | 5/2015 |
| CN | 106145089 | 11/2016 |
| CN | 106395796 | 2/2017 |
| CN | 107075744 | 8/2017 |
| EP | 1 810 949 | 7/2007 |
| EP | 3214212 | 9/2017 |
| KR | 20160049998 A | 5/2016 |
| RU | 2320858 C2 | 3/2008 |
| RU | 2419585 C2 | 5/2011 |
| RU | 2497752 C2 | 11/2013 |
| RU | 2621102 C2 | 5/2017 |

OTHER PUBLICATIONS

Request for the Submission of an Opinion issued for Korean Patent Application No. 10-2020-7030794, Dispatched Date: Jun. 15, 2022, 17 pages including English machine translation.

Office Action issued in Chinese Application No. 201810253208.2, Jun. 27, 2019, 6 pages.

International Search Report issued in International Application No. PCT/CN2018/080531, Dec. 29, 2018, 3 pages.

Extended European Search Report issued for European Patent Application No. 18913162.6, dated Oct. 21, 2021, 9 pages.

Rabbani, F. A. et al., "Catalytic Synthesis of Substrate-Free, Aligned and Tailored High Aspect Ratio Multiwall Carbon Nanotubes in an Ultrasonic Atomization Head CVD Reactor," Journal of Nanomaterials, vol. 2016, Article ID 4189456, 2016, pp. 1-10.

Office Action issued for Japanese Patent Application No. 2021-501062, Dispatch Date: Nov. 1, 2021, 3 pages.

\* cited by examiner (a)

(b)

(c)

(a)

(b)

(c)

CARBON NANOTUBE PREPARATION SYSTEM

TECHNICAL FIELD

The present disclosure relates to a carbon nanotube preparation device, in particular to a carbon nanotube preparation system.

BACKGROUND

As a typical one-dimensional nano-material, carbon nanotube material, which has excellent mechanical, thermal and electrical properties, is applied in a wide range of fields. Many universities, research institutes and companies, both at home and abroad, are studying how to synthesize carbon nanotube materials with better properties on a macroscopic level.

The common carbon nanotube synthesis method is preparing a macroscopic carbon nanotube material such as carbon nanotube film and carbon nanotube fiber based on the chemical vapor deposition (CVD) method. However, there is a big difference between laboratory studies and industrialized large-scale production, especially for CVD process in which the impacts caused by unstable factors are greater as the size of the devices increases. Many issues that do not appear in the laboratory stage will have a significant impact on the synthesis and quality of carbon nanotube materials during the industrialization. Therefore, how to improve the stability of the process and the continuity of production has become an important issue in the industrialization of carbon nanotubes.

In prior art, there is a method of guiding and pulling the growth direction and continuous growth of carbon nanotubes by setting an electric field or a magnetic field. However, during the industrialization, the complexity of the devices and the difficulty in controlling are increased, resulting in difficulties in applying the method maturely. Therefore, how to simply and practically improve the stability and continuity of the process remains to be solved.

SUMMARY OF THE INVENTION

On the basis of this, with regard to the problem of how to achieve the stability and continuity of carbon nanotube production, it is necessary to provide a carbon nanotube preparation system which can ensure the stability of the gas flow in the process and the continuous and stable synthesis of carbon nanotubes so as to promote the industrialization of carbon nanotube material production.

The present disclosure provides a carbon nanotube preparation system comprising:
- a pre-growth tube, for an early pre-reaction of raw materials before generation of carbon nanotubes;
- an atomizer, for atomizing the carbon nanotube raw materials and then spraying the atomized raw materials into the pre-growth tube; the atomizer is provided at the front end of the pre-growth tube, and has a spray output tube that extends into the pre-growth tube;
- a growth tube, for generating carbon nanotubes and continuous growth of the generated carbon nanotubes; the front end of the growth tube is hermetically connected to the rear end of the pre-growth tube; and
- a gas curtain generator, for forming a gas curtain enclosing the atomized raw materials around the outlet of the spray output tube, and the gas curtain extends parallel to the extension direction of the pre-growth tube; the gas curtain generator is provided inside the pre-growth tube.

In above carbon nanotube preparation system, the gas curtain is formed around the spray output tube. On the one hand, a laminar flow is formed in the pre-growth tube through the gas curtain to stabilize the gas flow, and on the other hand, stickiness of the carbon nanotubes or impurities is avoided, thereby ensuring the continuous growth of the carbon nanotubes.

In one embodiment, the gas curtain generator comprises at least one gas curtain forming plate which is provided with a plurality of gas holes.

In one embodiment, the gas curtain forming plate has a ring shape, and the spray output tube is located at the hollow center of the gas curtain forming plate; the gas holes are radially distributed on the gas curtain forming plate.

In one embodiment, the edge contour of the gas curtain forming plate matches the inner wall of the pre-growth tube, at least part of the gas holes are located in the edge area of the gas curtain forming plate so as to form a gas curtain flow clung to the inner wall of the pre-growth tube.

In one embodiment, the gas curtain generator further comprises at least one gas inlet for inputting carrier gas into the pre-growth tube, and the gas inlet is located at the front end of the pre-growth tube.

In one embodiment, the pre-growth tube is connected with the growth tube by a tubular first heat-insulating element.

In one embodiment, the temperature inside the pre-growth tube is within a range of 200 to 950° C.; and
the temperature inside the growth tube is within a range of 1100 to 1600° C.

In one embodiment, the pre-growth tube comprises a first pre-growth segment and a second pre-growth segment;
the first pre-growth segment is close to the front end of the pre-growth tube, and the second pre-growth segment is close to the rear end of the pre-growth tube; and
the temperature inside the first pre-growth segment is different from that inside the second pre-growth segment.

In one embodiment, a first temperature controller is provided outside the first pre-growth segment, and a second temperature controller is provided outside the second pre-growth segment; and
the first pre-growth segment is connected with the second pre-growth segment by a second heat-insulating element.

In one embodiment, the first temperature controller comprises a first heating unit and a first cooling unit; and
the second temperature controller comprises a second heating unit and a second cooling unit.

In one embodiment, the temperature inside the first pre-growth segment is within a range of 200 to 300° C.; and
the temperature inside the second pre-growth segment is within a range of 700 to 950° C.

In one embodiment, the inner wall of the growth tube is provided with an anti-sticking coating for preventing the nano-material from attaching on the inner wall of the growth tube.

In one embodiment, the anti-sticking coating is zirconium oxide or zinc oxide.

In one embodiment, the growth tube is provided with vent holes for passing the carrier gas to form a gas protective layer on the inner wall surface of the growth tube, and the vent holes penetrate the wall of the growth tube and are evenly distributed.

In one embodiment, an included angle between the axial direction of the vent hole and the extending direction of the growth tube is less than 5 degrees.

In one embodiment, the atomizer includes an ultrasonic atomizing nozzle for uniformly mixing, atomizing and then spraying out the raw materials, and an ultrasonic controller for adjusting an ultrasonic value.

In one embodiment, the nano-material synthesis system is vertical or horizontal.

In one embodiment, the pre-growth tube and the growth tube are provided vertically, the atomizer is provided vertically along the extending direction of the pre-growth tube and the growth tube.

In one embodiment, the gas curtain is distributed parallel along the direction of gravity.

BRIEF DESCRIPTION OF THE DRAWINGS

FIG. 3 is a schematic structural view of a gas curtain forming plate according to the embodiment as shown in FIG. 2; wherein FIG. 3a is a front view of the gas curtain forming plate, FIG. 3b is a sectional view of the gas curtain forming plate along B-B, and FIG. 3c is a partial enlarged view of the area D enclosed by the dashed line in FIG. 3b.

FIG. 4 is a schematic structural view of a gas curtain forming plate according to another embodiment of FIG. 2; wherein FIG. 4a is a front view of the gas curtain forming plate, FIG. 4b is a sectional view of the gas curtain forming plate along B-B, and FIG. 4c is a partial enlarged view of the area E enclosed by the dashed line in FIG. 4b.

DETAILED DESCRIPTION OF THE PREFERRED EMBODIMENTS

In order to make the above objects, features, and advantages of the present disclosure more apparent, the specific embodiments of the present disclosure are described in detail below with reference to the accompanying drawings. In the following description, numerous specific details are set forth in order to provide a full understanding of the present disclosure. However, the present disclosure can be implemented in many other ways than those described herein, and those skilled in the art can make similar improvements without departing from the essence of the present disclosure. Therefore, the present disclosure is not limited by the specific embodiments disclosed below.

At present, a method of preparing carbon nanotubes basically comprises decomposing the carbon source into atom or ion form using various applied energy, and then aggregating to generate carbon nanotube macroscopic material. In general, there are three main methods of preparing carbon nanotubes: arc discharge method, laser ablation method, and chemical vapor deposition method. In the industrialization, carbon nanotubes are generally prepared by chemical vapor deposition (CVD) method.

The method of preparing carbon nanotubes by CVD, mainly based on gaseous or liquid hydrocarbons as a carbon source, comprises atomizing the carbon source, adding catalyst at appropriate temperature to crack the carbon source into carbon clusters on the surface of the catalyst particles, forming carbon nanotubes by recombing the carbon atoms, and then obtaining the carbon nanotube material with different forms by a specially designed collecting device. Wherein, the catalyst is carried along with the carbon source by the carrier gas into the furnace body. This preparation method is called floating catalytic carbon nanotube preparation technology. In the present disclosure, the floating catalytic carbon nanotube process is mainly adopted to prepare carbon nanotubes.

Figure 1:
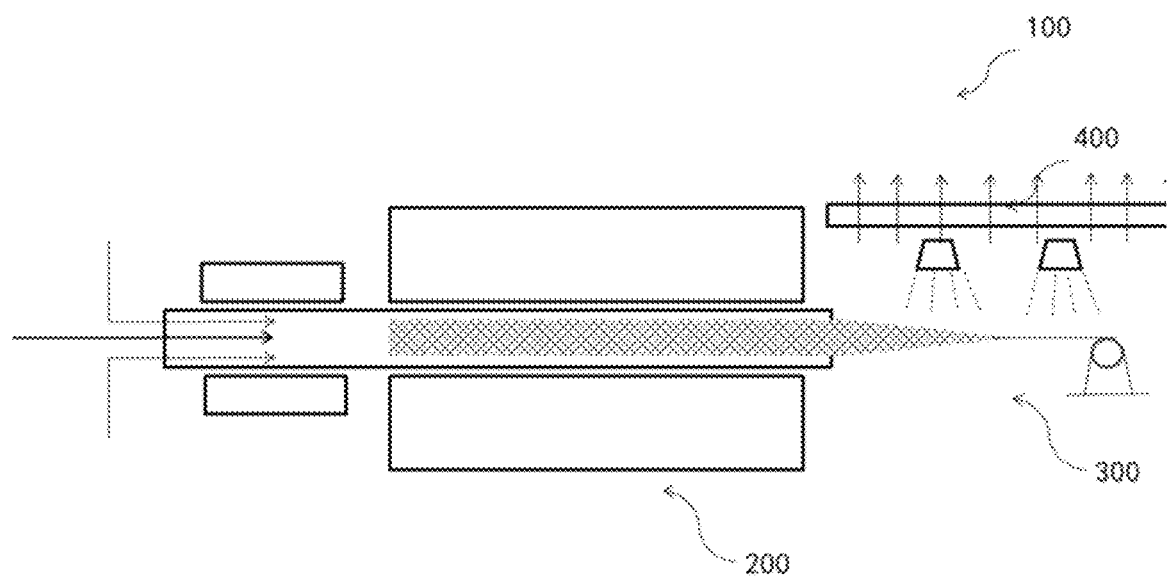
FIG. 1 is a schematic structural view of an industrialized carbon nanotube material continuous production system in the prior art.

FIG. 1 is a schematic structural view of an industrialized carbon nanotube material continuous production system according to one embodiment. As shown in FIG. 1, the carbon nanotube production system 100 comprises a carbon nanotube preparation system 200, a carbon nanotube collection system 300, and an exhaust system 400. The carbon nanotube preparation system 200 is used to synthesize raw materials into continuous carbon nanotubes. The carbon nanotube collection system 300 is used to densify the prepared carbon nanotubes, process and shape the prepared carbon nanotubes into a desired material, and collect the desired material. The carbon nanotube collection system 300 may process the carbon nanotubes into wire or film sheets and collect them into rolls. The exhaust system 400 is used to collect and treat the reacted gas together, so as to prevent the harmful gas in the production system 100 from being discharged into the atmosphere, and to prevent the residual gas in the production system 100 from interfering with the stability of the internal gas flow.

Figure 2:
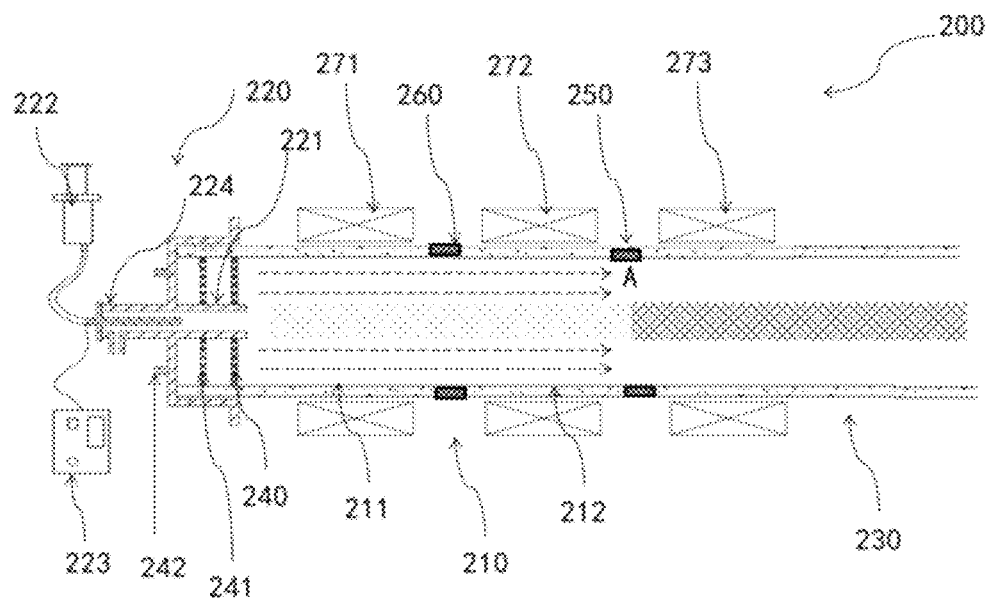
FIG. 2 is a schematic structural view of a carbon nanotube synthesis system according to one embodiment of the present disclosure.

FIG. 2 is a schematic structural view of a carbon nanotube synthesis system according to one embodiment of the present disclosure. As shown in FIG. 2, the carbon nanotube preparation system 200 comprises a pre-growth tube 210, an atomizer 220, a growth tube 230, and a gas curtain generator 240. The pre-growth tube 210 is used for an early pre-reaction of raw materials before the generation of carbon nanotubes. The atomizer 220 is used for atomizing the carbon nanotube raw materials and then spraying the atomized raw materials into the pre-growth tube 210. The atomizer 220 is provided at the front end of the pre-growth tube 210, and has a spray output tube 221 that extends into the pre-growth tube 210. The growth tube 230 is used for generating carbon nanotubes and continuous growth of the generated carbon nanotubes. The front end of the growth tube 230 is hermetically connected to the rear end of the pre-growth tube 210.

As shown in FIG. 2, in one embodiment, the atomizer 220 further comprises a peristaltic pump 222, an ultrasonic controller 223, and an ultrasonic atomizing nozzle 224. The reactive raw materials, after mixed uniformly in the peristaltic pump 222, with adjusting the ultrasonic value by the ultrasonic controller 223, enter the pre-growth tube 210 via the ultrasonic atomizing nozzle 224 and the spray output tube 221.

In one embodiment, the carbon source is gaseous carbon source or liquid carbon source, and may be hydrocarbon substances such as acetylene, ethanol, methane, ethylene, propylene, butylene, n-hexane, carbon monoxide, benzene and the like.

In one embodiment, the catalyst may be one or any combination of transition metals such as iron, diamond, nickel, and the like, as well as oxides or other compounds thereof.

In one embodiment, a catalyst precursor, which is decomposed into metal atoms at a certain temperature, may be used. Since the diameter of carbon nanotubes is determined by the diameter of the catalyst particles, it is possible to produce carbon nanotubes with high purity and uniform size distribution by selecting and controlling the type and particle size of the catalyst. In one embodiment, the catalyst precursor is ferrocene $Fe(C_5H_5)_2$.

In one embodiment, the raw material may also comprise an accelerant for increasing the activity of catalyst. The accelerant may be thiophene, other sulfur compounds or a combination thereof. The accelerant may be tetrahydrothiophene $C_4H_8S$.

In one embodiment, a carrier gas can be introduced into the atomizer 220. After the liquid carbon source and other raw material are atomized into evenly distributed droplets, the raw materials are carried into the pre-growth tube 210 by the carrier gas. The carrier gas may be $H_2$, He or any other inert gas. In one embodiment, the carrier gas may be a mixture gas of $H_2$ and Ar. The introduction of the carrier gas is not only beneficial for controlling the atomization form after atomization of the liquid carbon source to make the atomized liquid carbon source reach the high-temperature reaction zone inside the growth tube 230 quickly, but helps maintain the continuity and stability of the raw material supply.

In one embodiment, the temperature inside the spray output tube 221 is within a range of 100 to 250° C. in order to prevent the raw material mixture in the spray output tube 221 from condensing on the inner wall of the spray output tube 221.

In one embodiment, the total flow of the carrier gas in the atomizer is controlled within a range of 1 to 100 L/min, the injection rate of the liquid carbon source is controlled within a range of 10 to 1500 ml/h, and the injection flow of the gaseous carbon source is controlled within a range of 1 to 100 L/min, in order to ensure that the raw material input and the carbon nanotube synthesis rate are basically the same, which contributes to the continuity of carbon nanotube production.

In one embodiment, the pre-growth tube 210 has a front end and a rear end opposite to the front end. There is an extension channel between the front end and the rear end.

In one embodiment, the spray output tube 221 of the atomizer 220 is hermetically connected to the front end of the pre-growth tube 210. The spray output tube 221 may be fixed hermetically at the front end of the pre-growth tube 210 by providing a flange.

In one embodiment, the diameter of the pre-growth tube 210 is equal to that of the growth tube 230.

In one embodiment, the pre-growth tube 210 has a diameter within a range of 50 to 500 mm and a length within a range of 200 to 500 mm. The growth tube 230 has a length within a range of 500 to 2000 mm.

As shown in FIG. 2, the carbon nanotube preparation system 200 further comprises a gas curtain generator 240 that is used for forming a gas curtain enclosing the atomized raw materials around the outlet of the spray output tube 221, and the gas curtain extends parallel to the extension direction (A) of the pre-growth tube 210. The gas curtain generator 240 is provided inside the pre-growth tube 210.

It is to be understood that in the CVD process, the gas easily forms a turbulent flow in the furnace body, which is not conducive to the stability of subsequent processes. Especially in the industrialized process, since the stability of the gas flow is more difficult to control after the size of the equipment is enlarged, the turbulent flow should be avoided as much as possible in the carbon nanotube preparation system 200. The most ideal situation is to enable the gas to form a stable laminar flow. In the prior art, the carrier gas is usually introduced into a raw material injection device to increase the uniformity of vaporization of the liquid carbon source. Furthermore, a liner is provided between the raw material injection device and a reaction tube to guide the growth direction of carbon nanotubes. However, at the junction of the liner and the reaction tube, the gas flow creates a turbulent flow due to the change in cross-sectional area. On the other hand, as the reaction time increases, impurities generated in the reaction will accumulate at the end of the liner, i.e. at the junction of the liner and the reaction tube, which makes the carbon nanotubes easily stick to the liner wall at the end of the liner, resulting in the breakage of the carbon nanotubes and directly affecting the continuous growth of the carbon nanotubes. Therefore, the current technology still has deficiencies in controlling the stability of the gas flow and avoiding the breakage of the carbon nanotubes, which is not conducive to a stable and continuous floating process. Particularly in the large-diameter furnace tube floating catalytic reaction system, the above deficiencies will be more apparent.

Actually, in the above technical solution of the present disclosure, the traditional liner is canceled, and a gas curtain is formed around the spray output tube 221 of the atomizer 220. On the one hand, a laminar flow is formed in the pre-growth tube through the gas curtain to stabilize the gas flow, and on the other hand, sticking of the carbon nanotubes or impurities is avoided, thereby ensuring the continuous growth of the carbon nanotubes.

In one embodiment, the gas curtain generator 240 comprises at least one gas curtain forming plate 241 which is provided with a plurality of gas holes.

Figure 3:
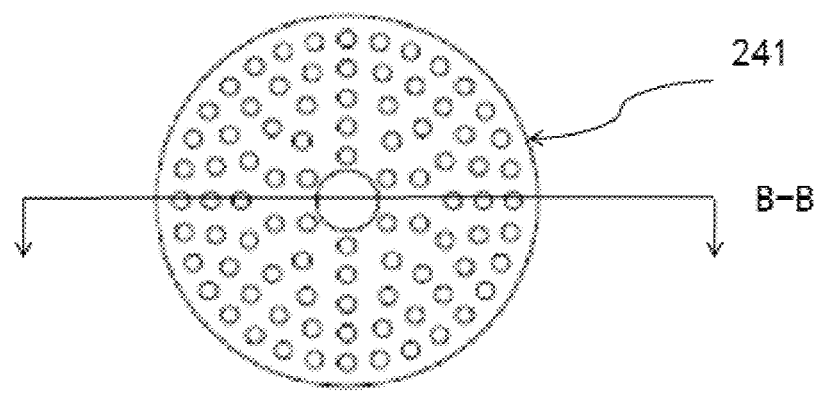
Figure 3:
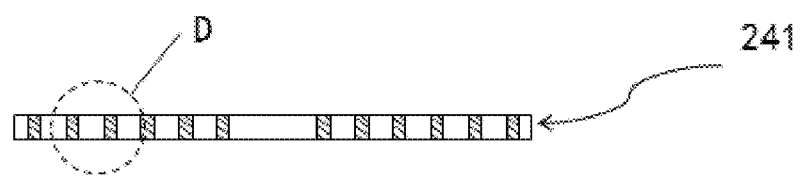
Figure 3:
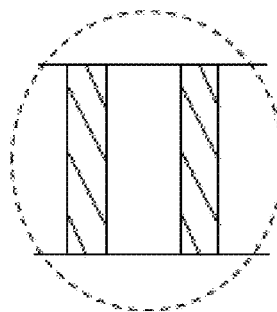

FIG. 3 is a schematic structural view of the gas curtain forming plate according to one embodiment as shown in FIG. 2; wherein FIG. 3a is a front view of the gas curtain forming plate, FIG. 3b is a sectional view of the gas curtain forming plate along B-B, and FIG. 3c is a partial enlarged view of the area D enclosed by the dashed line in FIG. 3b. As shown in FIG. 2 and FIG. 3, the gas curtain forming plate 241 has a ring shape, and the spray output tube 221 is located at the hollow center of the gas curtain forming plate 241. The gas holes are radially distributed on the gas curtain forming plate 241.

In one embodiment, the edge contour of the gas curtain forming plate 241 matches the inner wall of the pre-growth tube 210, at least part of the gas holes are located in the edge area of the gas curtain forming plate 241 so as to form a gas curtain flow clung to the inner wall of the pre-growth tube 210.

As shown in FIG. 3c, the gas holes on the gas curtain forming plate 241 are straight holes having the same hole diameter.

In one embodiment, the number of gas curtain forming plate 241 maybe plural. A plurality of gas curtain forming plates 241 are stacked one above the other along the extending direction of the pre-growth tube 210. The plurality of gas curtain forming plates 241 are in parallel relationship with each other.

In one embodiment, there are 1 to 4 gas curtain forming plates 241 in the gas curtain generator 240.

Figure 4:
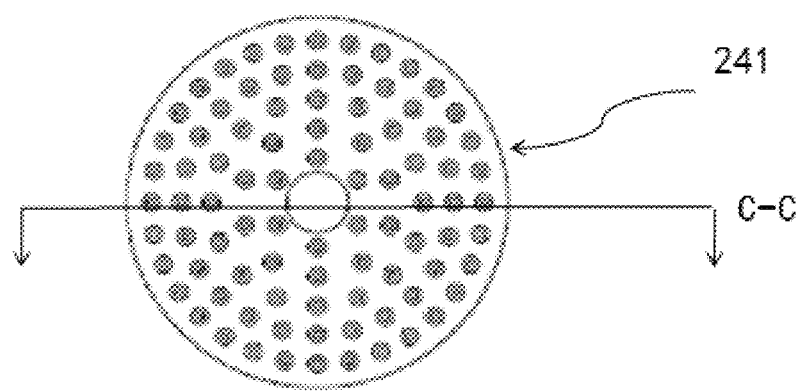
Figure 4:
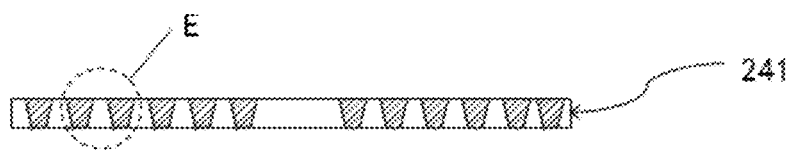
Figure 4:
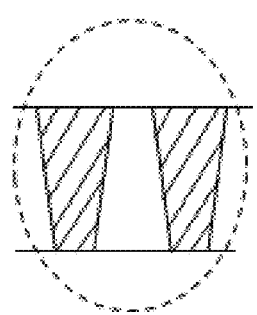

FIG. 4 is a schematic structural view of a gas curtain forming plate according to another embodiment in FIG. 2; wherein FIG. 4a is the front view of the gas curtain forming plate, FIG. 4b is the sectional view of the gas curtain forming plate along B-B, and FIG. 4c is a partial enlarged view of the area E enclosed by the dashed line in FIG. 4b. As shown in FIG. 4c, the gas holes on the gas curtain forming plate 241 maybe flared holes which have a diameter wider in the front, and narrower in the rear.

In one embodiment, the gas holes are symmetrically distributed along the hollow center at the gas curtain forming plate 241, and the number of gas holes on one side is 2 to 6. The diameter of the gas holes may be 10 cm.

As shown in FIG. 2, the gas curtain generator 240 further comprises at least one gas inlet 242 for inputting carrier gas into the pre-growth tube 210, and the gas inlet 242 is located at the front end of the pre-growth tube 210.

In one embodiment, the gas curtain generator 240 comprises two gas inlets 242 which are distributed on both sides of the spray output tube 221. The gas inlets 242 may be provided on the flange. The carrier gas enters the pre-growth tube 210 via the gas inlets 242, and forms a gas flow uniformly distributed in the same direction via 1 to 4 layers of the gas curtain forming plates 241.

In one embodiment, the total flow of the carrier gas inputted from the gas curtain generator 240 is controlled within a range of 1 to 20 L/min.

After the raw material gas enters the pre-growth tube 210, firstly the catalyst precursor needs to be decomposed to obtain catalyst iron atoms. Then, the accelerator needs to be decomposed to release sulfur atoms, and the sulfur atoms can interact with the cluster of catalyst particles to control the size distribution of the catalyst particles, thereby controlling the diameter of the carbon nanotube structure. Finally, the carbon source is decomposed and the carbon nanotubes are grown on the catalyst particles. Wherein, the temperature ranges of decomposition of the catalyst precursor, decomposition of the accelerator, and decomposition of the carbon source are all different. In order to ensure the smooth progress of the reaction and the quality of the carbon nanotubes, it is necessary to refine the reaction temperature in different regions inside the pre-growth tube 210 and the growth tube 230 to form a gradient temperature.

In one embodiment, the reaction including the decomposition of the catalyst precursor and the decomposition of the accelerator is performed in the pre-growth tube 210, and the reaction including the decomposition of the carbon source and the growth of the carbon nanotubes is performed in the growth tube 230. Therefore, the temperature inside the pre-growth tube 210 is different from that inside the growth tube 230.

In one embodiment, the temperature inside the pre-growth tube 210 is within a range of 200 to 950° C.; the temperature inside the growth tube 230 is within a range of 1100 to 1600° C.

As shown in FIG. 2, in one embodiment, the pre-growth tube 210 is connected with the growth tube 230 by a tubular first heat-insulating element 250.

The first heat-insulating element 250 is used for reducing the mutual interference between the temperature of the pre-growth tube 210 and the temperature of the growth tube 230. In order to ensure the decomposition of the carbon source, the temperature in the growth tube 230 needs to reach to a range of 1100 to 1600° C. In the rear end of the pre-growth tube, the temperature required for the decomposition of the accelerator is generally within a range of 700 to 950° C. There is a certain temperature difference between the pre-growth tube 210 and the growth tube 230. In order to ensure the relative independence of the temperature in each area and to avoid the related interference, the pre-growth tube 210 is separated from the growth tube 230 by a certain distance, and is connected with the growth tube 230 by the first heat-insulating element 250 having heat-insulating function, to reduce the interference between different areas.

In one embodiment, the first heat-insulating element 250 is composed of a heat insulating material, and the diameter of first heat-insulating element 250 is the same as that of the growth tube 230 and the pre-growth tube 210. The first heat-insulating element 250 is hermetically connected with the growth tube 230 and the pre-growth tube 210, respectively.

In one embodiment, the first heat-insulating element 250 is composed of a high-temperature heat insulating material that may be one of high-alumina brick, corundum, magnesium brick and high-temperature refractory fiber.

In one embodiment, the first heat-insulating element 250 has a diameter within a range of 50 to 500 mm, and a length within a range of 50 to 200 mm.

As shown in FIG. 2, in one embodiment, the pre-growth tube 210 is segmented and includes at least a first pre-growth segment 211 and a second pre-growth segment 212. The first pre-growth segment 211 is a portion close to the front end, and the second pre-growth segment 212 is a portion close to the rear end. The first pre-growth segment 211 is a reaction zone where the catalyst precursor decomposes, and the second pre-growth segment 212 is a reaction zone where the accelerator decomposes. The temperature inside the first pre-growth segment 211 is different from that inside the second pre-growth segment 212.

In one embodiment, the temperature inside the first pre-growth segment 211 is within a range of 200 to 300° C. The temperature inside the second pre-growth segment 212 is within a range of 700 to 950° C.

In one embodiment, the first pre-growth segment 211 is connected with the second pre-growth segment 212 by a second heat-insulating element 260 in order to reduce the temperature interference between the first pre-growth segment 211 and the second pre-growth segment 212.

In one embodiment, the second heat-insulating element 260 is composed of a heat-insulating material. The diameter of second heat-insulating element 260 is the same as that of the first pre-growth segment 211 and the second pre-growth segment 212. Two sides of the second heat-insulating element 260 are hermetically connected with the first pre-growth segment 211 and the second pre-growth segment 212, respectively.

In one embodiment, the second heat-insulating element 260 has a diameter within a range of 50 to 500 mm, and a length within a range of 50 to 200 mm.

As shown in FIG. 2, a first temperature controller 271, a second temperature controller 272, and a third temperature controller 273 are also provided outside the first pre-growth segment 211, the second pre-growth segment 212, and the growth tube 230, respectively.

The first temperature controller 271 is used for controlling the temperature inside the first pre-growth segment 211, namely controlling the temperature inside the first pre-growth segment 211 within a certain range and ensuring the uniform temperature distribution in the first pre-growth segment 211.

In one embodiment, the first temperature controller 271 comprises a first heating unit and a first cooling unit. The first temperature controller 271 further comprises a number of temperature sensors that are capable to measure the temperature value inside the first pre-growth segment 211.

The second temperature controller 272 is used for controlling the temperature inside the second pre-growth segment 212, namely controlling the temperature inside the second pre-growth segment 212 within a certain range and ensuring the uniform temperature distribution in the second pre-growth segment 212. In one embodiment, the second temperature controller 272 comprises a second heating unit and a second cooling unit. The second temperature controller 272 further comprises a number of temperature sensors that are capable to measure the temperature value inside the second pre-growth segment 212.

A third temperature controller 273 is used for controlling the temperature inside the growth tube 230, namely controlling the temperature inside the growth tube 230 within a certain range and ensuring the uniform temperature distribution in the growth tube 230. In one embodiment, the third temperature controller 273 comprises a third heating unit and a third cooling unit. The third temperature controller 273 further comprises a number of temperature sensors that are capable to measure the temperature value inside the growth tube 230.

In one embodiment, the first heating unit, the second heating unit and the third heating unit may use steam heating, hot water heating, mineral oil heating, electromagnetic induction heating, resistance heating or the like.

In one embodiment, the first cooling unit, the second cooling unit and the third cooling unit may use refrigerant cooling, cooling water cooling, cooling oil cooling, or the like.

In the present disclosure, the reaction region is refined and divided into three parts: the first pre-growth tube, the second pre-growth tube, and the growth tube. There is a certain space provided between each segment to reduce the interference between each other. By segmented management, the accuracy of temperature is improved, which is beneficial to the precise control of the process and improves the quality of carbon nanotubes.

In one embodiment, the inner wall of the growth tube 230 is provided with an anti-sticking coating for preventing the nano-material from attaching on the inner wall of the growth tube 230.

In one embodiment, the anti-sticking coating is zirconium oxide or zinc oxide.

During the industrialized continuous production of carbon nanotubes, the production cannot be continued due to the breakage of carbon nanotubes, which is the most important factor that hinders the continuous production of carbon nanotubes. Wherein, the adhesion and stickiness of carbon nanotubes to the tube wall are the main causes of carbon nanotubes fracture. By preparing a high temperature resistant anti-sticking coating of zirconium oxide or zinc oxide on the inner wall of the growth tube 230, it is advantageous to reduce the adhesion and sticking of the carbon nanotubes to the tube wall.

In one embodiment, the arithmetic mean deviation Ra of the surface roughness profile of the anti-sticking coating is within a range of 0.1 μm to 1 μm.

In one embodiment, the growth tube 230 is provided with vent holes for passing a carrier gas to form a gas protective layer on the inner wall surface of the growth tube, and the vent holes penetrate the wall of the growth tube 230 and are evenly distributed. By providing a protective gas near the inner wall of the growth tube 230, the sticking of the carbon nanotubes can be avoided, and it is also advantageous to guide the moving direction of the carbon nanotubes and assist the collection of the carbon nanotubes.

In one embodiment, the included angle between the axial direction of the vent hole and the extending direction of the growth tube is less than 5 degrees, which allows the carrier gas to form a gas protective layer on the inner wall surface.

In one embodiment, the carbon nanotube preparation system 200 may be in a horizontal distribution structure, that is, the atomizer 220, the pre-growth tube 210, and the growth tube 230 are sequentially arranged horizontally.

Figure 5:
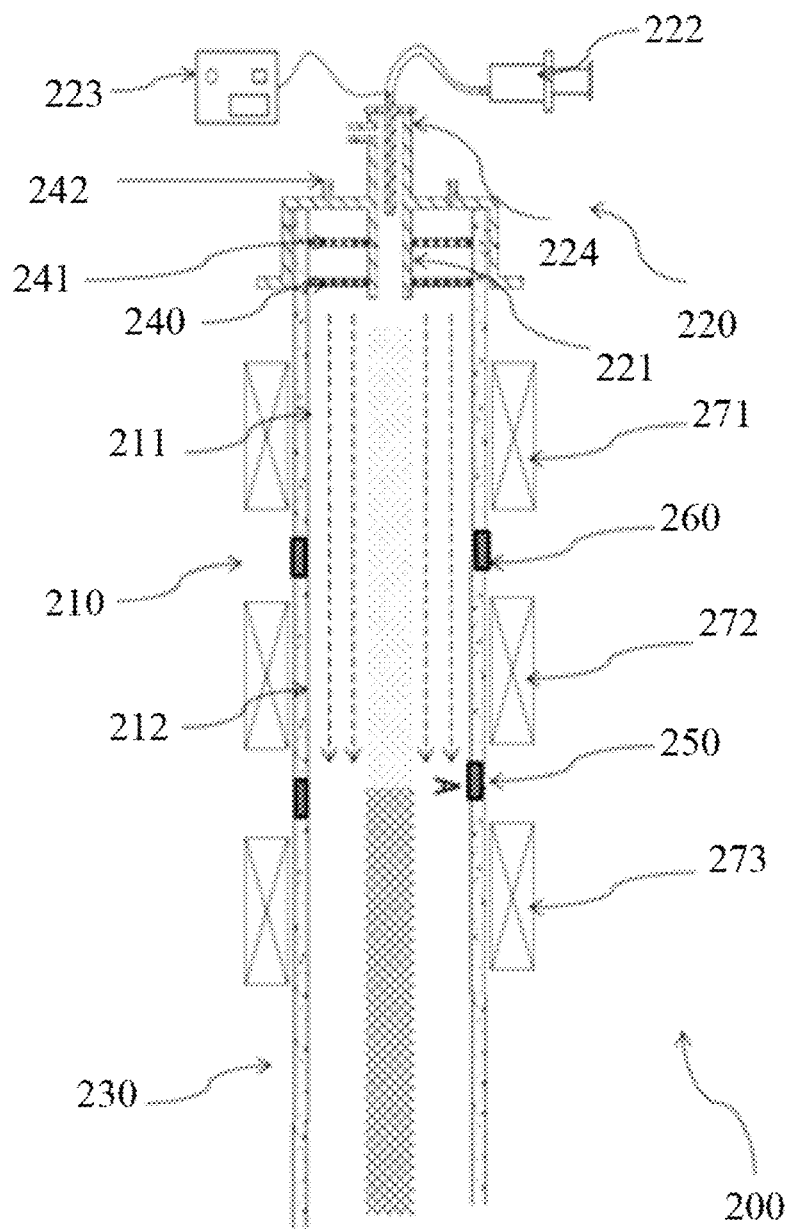
FIG. 5 is a schematic structural view of a carbon nanotube synthesis system in a vertical distribution structure according to one embodiment of the present disclosure.

In one embodiment, the carbon nanotube preparation system 200 may be in a vertical distribution structure (as illustrated in FIG. 5), that is, the atomizer 220, the pre-growth tube 210, and the growth tube 230 are sequentially arranged vertically. In this way, the gas curtain formed by the gas curtain generator 240 is distributed parallel along the direction of gravity.

In one embodiment, the carbon nanotube preparation system 200 may be in a vertical distribution structure. The carbon nanotube collection system 300 and the exhaust system 400 may be in a horizontal distribution structure to facilitate the collection of carbon nanotubes.

It should be understood that in the horizontal structure, the gas is affected by gravity, thus it is difficult to ensure that the gas curtain can maintain an absolute horizontal laminar flow in the horizontal direction. However, by arranging the carbon nanotube preparation system 200 in a vertical type, it is possible to overcome the influence of gravity and ensure the absolute laminar flow of the gas curtain. Moreover, the effect of gravity may help the consistency of the direction of the gas flow in the pre-growth tube 210 and the growth tube 230, and improve the stability of the gas flow in the system greatly. This advantage is unmatched by horizontal systems.

In practical applications, the vertical system can continuously produce for up to 15 hours, thus superior to the horizontal system (usually the horizontal system can produce about 5 hours of continuous production).

The nanotube film materials obtained by the preparation system in the present disclosure may have a conductivity within a range of $5 \times 10^4$ to $5 \times 10^5$ S/m (measured by a four-probe resistivity meter) and a tensile strength within a range of 80 to 200 MPa (measured by a nanotensile tester).

The technical features of the above-described embodiments may be combined arbitrarily. For brevity of description, all possible combinations of the technical features in the above embodiments are not described. However, as long as there is no contradiction in the combination of these technical features, it should be considered within the scope of this specification.

The above-mentioned embodiments merely represent several embodiments of the present disclosure, and the description thereof is more specific and detailed, but it should not be construed as limiting the scope of the disclosure. It should be noted that, for those skilled in the art, several variations and improvements may be made without departing from the concept of the present disclosure, and these are all within the protection scope of the present disclosure. Therefore, the scope of protection of the present disclosure shall be subject to the appended claims.

The invention claimed is:

1. A carbon nanotube preparation system, comprising:
   a pre-growth tube configured for an early pre-reaction of raw materials before generation of carbon nanotubes;
   an atomizer configured to atomize the raw materials for the generation of the carbon nanotubes and then to spray the atomized raw materials into the pre-growth tube; wherein the atomizer is provided at a front end of the pre-growth tube and has a spray output tube that extends into the pre-growth tube;
   a growth tube configured to generate and continuously grow the carbon nanotubes; wherein the front end of the growth tube is hermetically connected to a rear end of the pre-growth tube; and a gas curtain generator configured to form a gas curtain enclosing the atomized raw materials around an outlet of the spray output tube, wherein the gas curtain extends parallel to an extension direction of the pre-growth tube and the gas curtain generator is provided inside the pre-growth tube, wherein the gas curtain generator comprises at least one gas curtain forming plate which is provided with a plurality of gas holes, the gas curtain forming plate has a ring shape, and the spray output tube is located at a hollow center of the gas curtain forming plate; an outer wall of the spray output tube is in contact with an inner wall of the gas curtain forming plate; and the gas holes are radially distributed on the gas curtain forming plate, and an edge contour of the gas curtain forming plate matches an inner wall of the pre-growth tube.

2. The carbon nanotube preparation system of claim 1, wherein at least part of the gas holes are located in an edge area of the gas curtain forming plate so as to form a gas curtain flow clung to the inner wall of the pre-growth tube.

3. The carbon nanotube preparation system of claim 1, wherein the gas curtain generator further comprises at least one gas inlet for inputting carrier gas into the pre-growth tube, and the gas inlet is located at the front end of the pre-growth tube.

4. The carbon nanotube preparation system of claim 1, wherein the pre-growth tube is connected with the growth tube by a tubular first heat-insulating element.

5. The carbon nanotube preparation system of claim 4, wherein a temperature inside the growth tube is within a range of 1100 to 1600° C.

6. The carbon nanotube preparation system of claim 1, wherein an inner wall of the growth tube is provided with a coating of zirconium oxide or zinc oxide for preventing the carbon nanotubes from attaching on the inner wall of the growth tube.

7. The carbon nanotube preparation system of claim 1, wherein the atomizer includes an ultrasonic atomizing nozzle for uniformly mixing atomizing and then spraying the raw materials, and an ultrasonic controller for adjusting an ultrasonic value.

8. The carbon nanotube preparation system of claim 1, wherein the carbon nanotube preparation system is vertical or horizontal.

9. The carbon nanotube preparation system of claim 8, wherein the pre-growth tube and the growth tube are provided vertically, the atomizer is provided vertically along the extending direction of the pre-growth tube and the growth tube.

10. The carbon nanotube preparation system of claim 9, wherein the gas curtain is distributed parallel along direction of gravity.

11. The carbon nanotube preparation system of claim 1, wherein the pre-growth tube is segmented and comprises a first pre-growth segment and a second pre-growth segment; the first pre-growth segment is a portion close to the front end of the pre-growth tube, and the second pre-growth segment is a portion close to the rear end of the pre-growth tube;

wherein a first temperature controller is provided outside the first pre-growth segment, and a temperature inside the first pre-growth segment is within a range of 200° C. to 300° C., and a second temperature controller is provided outside the second pre-growth segment, and a temperature inside the second pre-growth segment is within a range of 700° C. to 950° C.

12. The carbon nanotube preparation system of claim 11, wherein the first pre-growth segment is connected with the second pre-growth segment by a second heat-insulating element.

13. The carbon nanotube preparation system of claim 11, wherein the first temperature controller comprises a first heating unit and a first cooling unit; and the second temperature controller comprises a second heating unit and a second cooling unit.

* * * * *